(12) United States Patent
Park et al.

(10) Patent No.: US 8,833,296 B2
(45) Date of Patent: Sep. 16, 2014

(54) DISPENSING APPARATUS AND DISPENSING METHOD

(75) Inventors: Jae-Seok Park, Yongin (KR); Yun-Mi Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 327 days.

(21) Appl. No.: 12/926,312

(22) Filed: Nov. 9, 2010

(65) Prior Publication Data

US 2011/0107963 A1    May 12, 2011

(30) Foreign Application Priority Data

Nov. 10, 2009  (KR) .................. 10-2009-0108270

(51) Int. Cl.
| | | |
|---|---|---|
| B05C 5/02 | (2006.01) | |
| H01L 21/67 | (2006.01) | |
| B41J 2/14 | (2006.01) | |
| B05B 1/20 | (2006.01) | |
| H01L 51/00 | (2006.01) | |

(52) U.S. Cl.
CPC .............. *H01L 21/6715* (2013.01); *B41J 2/14* (2013.01); *B05B 1/20* (2013.01); *H01L 51/0005* (2013.01)
USPC ........... 118/663; 118/666; 118/667; 118/708; 118/712; 118/313; 118/315; 118/411; 118/412; 118/429

(58) Field of Classification Search
CPC ... H01L 21/6715; H01L 51/0005; B05B 1/20; B05C 5/027; B41J 2/135; B41J 2/14; B41J 2/14016
USPC ........ 118/663, 666, 667, 708, 712, 302, 313, 118/315, 411, 412, 429; 239/548; 347/9, 347/12, 13, 19
See application file for complete search history.

(56) References Cited

U.S. PATENT DOCUMENTS

| | | | |
|---|---|---|---|
| 6,109,719 A * | 8/2000 | Cornell ........................... | 347/14 |
| 7,182,429 B2 * | 2/2007 | Iwata ............................... | 347/40 |
| 7,182,815 B2 * | 2/2007 | Katagami et al. ............. | 118/665 |
| 2002/0063747 A1 * | 5/2002 | Van Der Meijs et al. ....... | 347/19 |
| 2007/0190233 A1 | 8/2007 | Chung | |
| 2007/0211107 A1 * | 9/2007 | Ikeda .............................. | 347/47 |
| 2008/0197774 A1 | 8/2008 | Yoo | |
| 2009/0277383 A1 * | 11/2009 | Chuang ........................ | 118/667 |

FOREIGN PATENT DOCUMENTS

| | | |
|---|---|---|
| JP | 2002-200746 | 7/2002 |
| JP | 2003-126751 A | 5/2003 |
| JP | 2003-243165 A | 8/2003 |
| JP | 2003-311944 | 11/2003 |
| JP | 2006-247841 | 9/2006 |
| JP | 2008-027836 | 2/2008 |
| JP | 2008-173528 | 7/2008 |

(Continued)

*Primary Examiner* — Laura Edwards
(74) *Attorney, Agent, or Firm* — Lee & Morse, P.C.

(57) ABSTRACT

A dispensing apparatus includes a dispensing unit having a main body, a channel through the main body, and a plurality of nozzles connected to the main body, the plurality of nozzles being configured to dispense fluid flowing in the channel, a gap sensor unit configured to determine size of gaps between adjacent nozzles in the dispensing unit, and a thermal expansion adjusting unit configured to thermally expand or contract the main body of the dispensing unit to adjust the gap size between adjacent nozzles to a predetermined size, based on the gap size determined by the gap sensor unit.

9 Claims, 6 Drawing Sheets

(56) References Cited

FOREIGN PATENT DOCUMENTS

| KR | 10 1998-0043942 A | 9/1998 |
| KR | 10 1998-0063882 A | 10/1998 |
| KR | 10-0577596 B1 | 11/2004 |
| KR | 10 2005-0043331 A | 5/2005 |
| KR | 10 2006-0038806 A | 5/2006 |
| KR | 10-0713176 B1 | 9/2006 |
| KR | 10 2006-0133379 A | 12/2006 |
| KR | 10-0756581 B1 | 8/2007 |
| KR | 10 2008-0077821 A | 8/2008 |
| KR | 10 2008-0079843 A | 9/2008 |
| WO | WO-2006/085561 A1 | 7/2006 |

\* cited by examiner

DISPENSING APPARATUS AND DISPENSING METHOD

CROSS-REFERENCE TO RELATED APPLICATION

Korean Patent Application No. 10-2009-0108270, filed on Nov. 10, 2009, in the Korean Intellectual Property Office, and entitled: "Dispensing Apparatus and Dispensing Method," is incorporated by reference herein in its entirety.

BACKGROUND

1. Field

The described technology relates to a dispensing apparatus. More particularly, the described technology relates to a dispensing apparatus that dispenses fluid to a substrate, and a dispensing method thereof.

2. Description of the Related Art

In general, dispensing apparatuses are used to apply various types of fluid to an object. For example, a dispensing apparatus may be used to apply an organic light emitting material for pixels of an organic light emitting diode (OLED) display to a substrate during manufacturing of the OLED display.

In particular, the OLED display may include a plurality of pixels. In order to apply the organic light emitting material to the plurality pixels, a fluid organic light emitting material may be applied to the pixels by a dispensing apparatus. However, when gaps between the plurality of pixels in the OLED display are decreased, e.g., due to development of microelectromechanical systems (MEMS), it may be difficult to accurately apply the organic light emitting material to the plurality of pixels of the OLED display.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to a dispensing apparatus, which substantially overcomes one or more of the problems due to the limitations and disadvantages of the related art.

It is therefore a feature of an embodiment to provide a dispensing apparatus capable of accurately applying a light emitting material to a plurality of pixel structures of an OLED display.

It is therefore another feature of an embodiment to provide a dispensing method for accurately applying a light emitting material to a plurality of pixel structures of an OLED display.

At least one of the above and other features and advantages may be realized by providing a dispensing apparatus, including a dispensing unit having a main body, a channel through the main body, and a plurality of nozzles connected to the main body, the plurality of nozzles being configured to dispense fluid flowing in the channel, a gap sensor unit configured to determine size of gaps between adjacent nozzles in the dispensing unit, and a thermal expansion adjusting unit configured to thermally expand or contract the main body of the dispensing unit to adjust the gap size between adjacent nozzles to a predetermined size, based on the gap size determined by the gap sensor unit.

The thermal expansion adjusting unit may include a heater that increases the temperature of the main body, a temperature sensor that senses the temperature of the main body, and a temperature controller that controls the heater such that the temperature of the main body sensed by the temperature sensor reaches a predetermined temperature.

The thermal expansion adjusting unit may further include a cooler that decreases the temperature of the main body, and the temperature controller may further control the cooler such that the temperature of the main body sensed by the temperature sensor reaches a predetermined temperature.

The gap sensor unit may be configured to further determine size of gaps between adjacent pixel structures on a substrate, and the thermal expansion adjusting unit may be configured to adjust the gap size between adjacent nozzles in the dispensing unit in accordance with the size of gaps between adjacent pixels structures, as determined by the gap sensor unit. The gap sensor unit may be a camera.

The dispensing apparatus may further include a seating unit where the substrate to which the fluid is dispensed is seated, and an arranging unit that arranges the main body on the substrate by moving one or more of the seating unit and the main body. The dispensing unit may be made of invar or stainless steel.

At least one of the above and other features and advantages may also be realized by providing a dispensing method, including providing a substrate having a plurality of pixel structures thereon, arranging a dispensing unit above the substrate, the dispensing unit including a main body, a channel through the main body, and a plurality of nozzles connected to the main body, determining size of gaps between adjacent nozzles in the dispensing unit with a gap sensor unit, thermally expanding or contracting the main body of the dispensing unit with a thermal expansion adjusting unit, such that the gaps between adjacent nozzles are adjusted to reach a predetermined size, based on the gap size determined by the gap sensor unit, and dispensing fluid flowing in the channel of the dispensing unit onto the pixel structures on the substrate through the plurality of nozzles.

Thermally expanding or contracting the main body may include adjusting gaps between adjacent nozzles to correspond to gaps between adjacent pixel structures on the substrate. Adjusting the gaps between adjacent nozzles to correspond to the gaps between adjacent pixel structures may include sensing the temperature of the main body, and increasing or decreasing the temperature of the main body such that the sensed temperature of the main body reaches a predetermined temperature. Adjusting the gaps between adjacent nozzles to correspond to the gaps between adjacent pixel structures may include aligning each nozzle with a respective pixel structure. Arranging the dispensing unit on the substrate may include seating the substrate on the seating unit, and arranging the main body on the substrate by moving one or more of the seating unit and the dispensing unit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
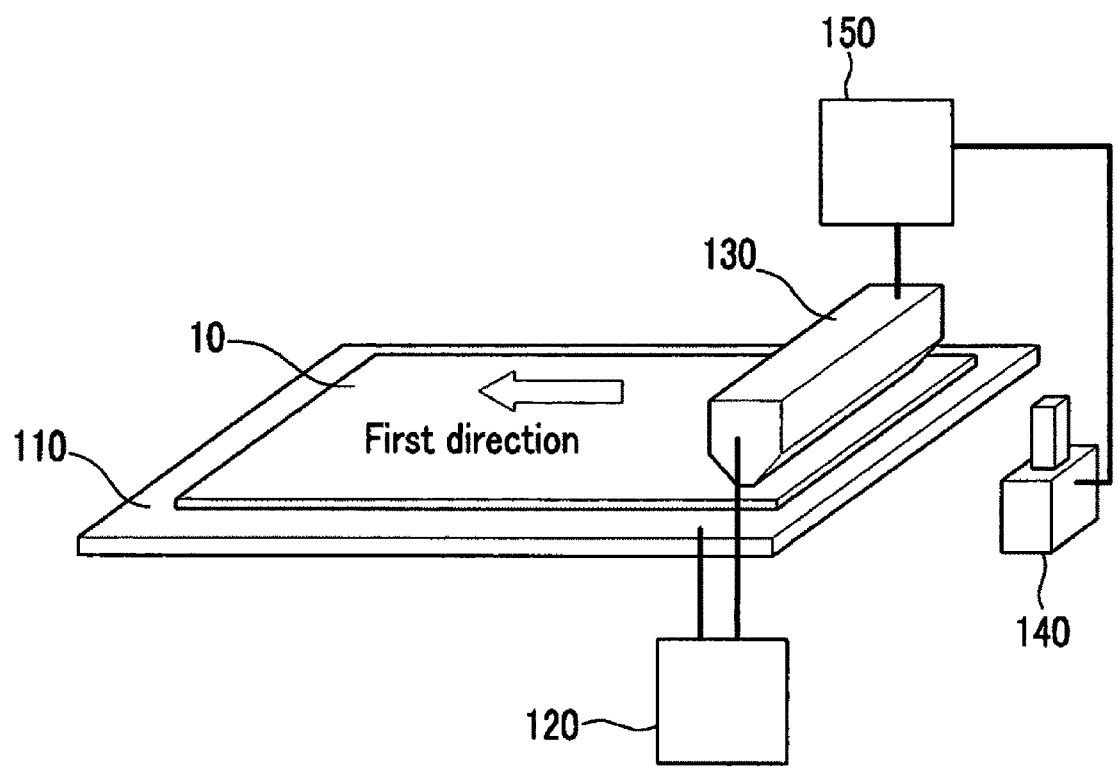
FIG. 1 illustrates a schematic perspective view of a dispensing apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereafter, a dispensing apparatus 100 according to an exemplary embodiment is described with reference to FIG. 1. FIG. 1 illustrates a schematic perspective view of the dispensing apparatus 100. It is noted that the dispensing apparatus 100 is an apparatus that dispenses fluid organic light emitting material for an OLED display. However, the dispensing apparatus 100 is not limited to fluid organic light emitting material and may dispense other materials, e.g., fluid phosphor.

Referring to FIG. 1, the dispensing apparatus 100 according to an exemplary embodiment may include a seating unit 110, an arranging unit 120, a dispensing unit 130, a gap sensor unit 140, and a thermal expansion adjusting unit 150.

The seating unit 110 may support a substrate 10 to be processed. In other words, fluid light emitting material may be dispensed onto the substrate 10 positioned on the seating unit 110. The seating unit 110 may be moved and adjusted by the arranging unit 120.

The arranging unit 120 may arrange the dispensing unit 130 with respect to the substrate 10 seated on the seating unit 110. For example, the arranging unit 120 may move the seating unit 110 to a predetermined position, so the dispensing unit 130 may correspond to the predetermined position of the substrate 10. In another example, the arranging unit 120 may move the seating unit 110, such that the dispensing unit 130 may moves from one side to the other side of the substrate 10 in a first direction to correspond to the substrate 10. In yet other examples, the arranging unit 120 may arrange the dispensing unit 130 with respect to the substrate 10 seated on the seating unit 110 by moving the dispensing unit 130, or may arrange the dispensing unit 130 with respect to the substrate 10 seated on the seating unit 110 by moving the seating unit 110 and the dispensing unit 130.

The dispensing unit 130 may, e.g., directly, dispense the fluid organic light emitting material onto the substrate. The dispensing unit 130 will be described in more detail below with reference to FIG. 2.

Figure 2:
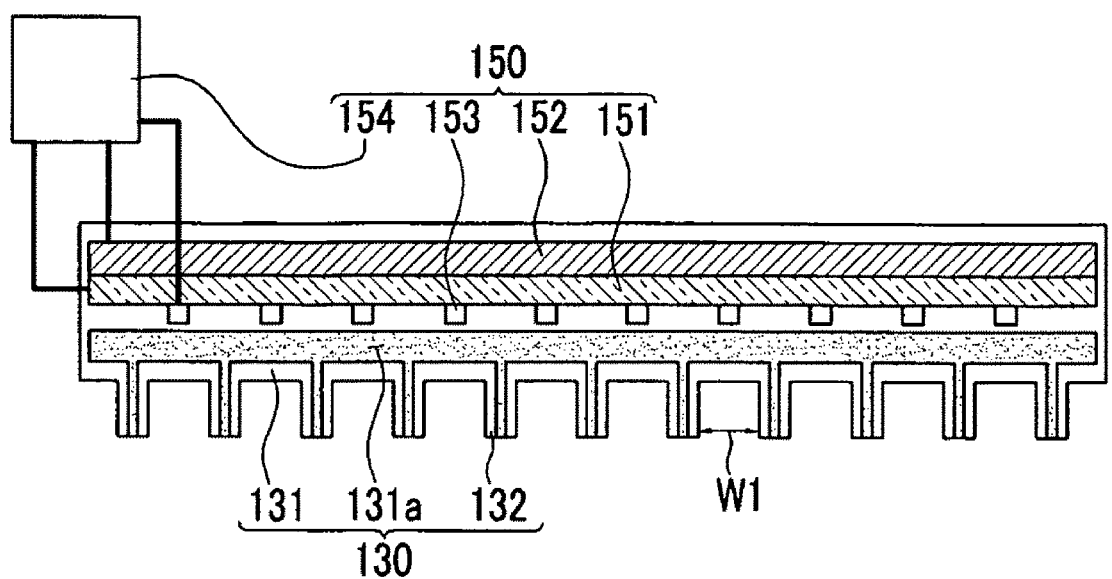
FIG. 2 illustrates a detailed cross-sectional view of a dispensing unit and a thermal expansion adjusting unit in a dispensing apparatus according to an exemplary embodiment.

FIG. 2 illustrates a detailed cross-sectional view of the dispensing unit 130 and the thermal expansion adjusting unit 150. Referring to FIG. 2, the dispensing unit 130 may include a main body 131 and a plurality of nozzles 132.

The main body 131 may extend in one direction corresponding to the substrate 10. For example, as illustrated in FIG. 1, the main body 131 may extend along a direction perpendicular to the first direction along an entire side of the substrate 10. As illustrated in FIG. 2, the main body may include a channel 131a, e.g., along an entire length of the main body 131, through which the fluid light emitting material may flow. The main body 131 may be connected with a connecting member (not shown), e.g., a tube, so the channel 131a of the main body 131 may be in fluid communication with the connecting member to receive the fluid-type light emitting material from the connecting member.

The plurality of nozzles 132 in the dispensing unit 130 may be connected with the main body 131, and may be in fluid communication with the channel 131a of the main body 131. Therefore, the fluid-type light emitting material may flow from the channel 131a through the nozzles 132 outside the dispensing unit 130, e.g., onto the substrate 10. The nozzles 132 may have opening/closing portions, and the opening/closing portions may control the dispensing of the fluid-type light emitting material from the channel 131a of the main body 131 to the substrate 10 through the nozzles 132, i.e., by opening or closing the nozzles 132. For example, a number of nozzles 132 may correspond to a number of pixels, e.g., in a line of pixels along a second direction, on the substrate 10. The plurality of nozzles 132 may be spaced apart from each other along a second direction, i.e., a direction substantially perpendicular to the first direction. For example, each two adjacent nozzles 132 may have a gap W1 therebetween along the second direction, e.g., the gaps between the nozzles 132 may have a constant width.

The dispensing unit 130 may be made of a steel-based material, e.g., invar or stainless steel, and may, e.g., substantially entirely and uniformly, thermally expand with an increase in temperature of the dispensing unit 130. For example, when the temperature of the main body 131 of the dispensing unit 130 increases by about 1° C., the gap W1 between two adjacent nozzles 132 of the dispensing unit 130 may increase by about 1 μm.

Referring to FIG. 1, the gap sensor unit 140 may sense the gap W1, e.g., pitch, between the nozzles 132 of the dispensing unit 130. In addition, the gap sensor unit 140 may sense a size, e.g., a width, of a gap, e.g., pitch, between adjacent pixel structures along the second direction, on the substrate 10 to be applied with the fluid-type light emitting material.

In detail, the gap sensor unit 140 may sense the gap W1 between the nozzles 132, i.e., may detect a width of the gap W1 between two adjacent nozzles 132, and then may transmit the sensed value to the thermal expansion adjusting unit 150. The gap sensor unit 140 may also sense the gap between the pixel structures, i.e., may detect a width of the gap between two adjacent pixel structures on the substrate 10, and then may transmit the sensed value to the thermal expansion adjusting unit 150. It is noted that the plurality of pixel structures may be formed on the substrate 10 and may define a plurality of pixels in the OLED display.

For example, the gap sensor unit 140 may include a camera. In this case, the gap W1 between the nozzles 132 of the dispensing unit 130 and the gap between the pixel structures of the substrate 10 may be photographed by the gap sensor unit 140 to be represented by images. Then, the gap sensor unit 140 may calculate the gap W1 between the nozzles 132 and the gap between the pixel structures of the substrate 10 from the photographed images, and then may transmit the calculated values to the thermal expansion adjusting unit 150.

The thermal expansion adjusting unit 150 may thermally expand the main body 131 of the dispensing unit 130 to modify the gap W1 between adjacent nozzles 132, such that the nozzles 132 of the dispensing unit 130 may correspond to the pixel structures of the substrate 10, on the basis of the gap W1 between the nozzles 132 of the dispensing unit 130 and the gap between the pixel structures of the substrate 10 as sensed by the gap sensor unit 140. The thermal expansion adjusting unit 150 will be described in more detail below with reference to FIG. 2.

Referring to FIG. 2, the thermal expansion adjusting unit 150 may include a heater 151, a cooler 152, a temperature sensor 153, and a temperature controller 154.

The heater 151 may be positioned inside the main body 131 or outside the main body 131 in contact with the main body 131, and may increase the temperature of the main body 131. The heater 151 may be positioned to correspond to the entire main body 131, e.g., the heater 151 may overlap an entire top surface of the main body 131 or the entire top surface and two side surfaces of the main body 131, to simultaneously increase the temperature of the entire main body 131.

The cooler 152 may be positioned inside the main body 131 or outside the main body 131 in contact with the main body, and may decrease the temperature of the main body 131. The cooler 152 may be positioned to correspond to the entire main body 131, e.g., the heater 151 may overlap an entire top surface of the main body 131 or the entire top surface and two side surfaces of the main body 131, to simultaneously decrease the temperature of the entire main body 131.

The temperature sensor 153 may sense the temperature of the main body 131. The temperature sensor 153 may sense the temperature of the main body 131 that has been increased or decreased by the heater 151 or the cooler 152, and then may transmit the sensed value to the temperature controller 154.

The temperature controller 154 may control the heater 151 or the cooler 152 to adjust the temperature of the main body 131 to a predetermined temperature level, i.e., such that the temperature of main body 131 as sensed by the temperature sensor 153 reaches the predetermined temperature level. The predetermined temperature level refers hereinafter to a temperature at which the main body 131 of the dispensing unit 130 thermally expands or contracts to have the nozzles 132 correspond to, e.g., align with, the pixel structures of the substrate 10.

That is, the temperature controller 154 may control the heater 151 and/or the cooler 152, such that the nozzles 132 may accurately correspond to, e.g., be aligned with, the pixel structures on the basis of the gap W1 between the nozzles 132 and the gap between the pixel structures of the substrate 10 that have been sensed by the gap sensor unit 140. When the temperature of the main body 131 reaches the predetermined temperature, as the temperature controller 154 controls the heater 151 or cooler 152, the nozzles 132 connected to the main body 131 may correspond to the pixel structures of the substrate 10 when the main body 131 thermally expands, such that the fluid-type light emitting material flowing through the channel 131a of the main body 131 may be dispensed to the pixel structures of the substrate 10 through the nozzle 132.

Figure 3:
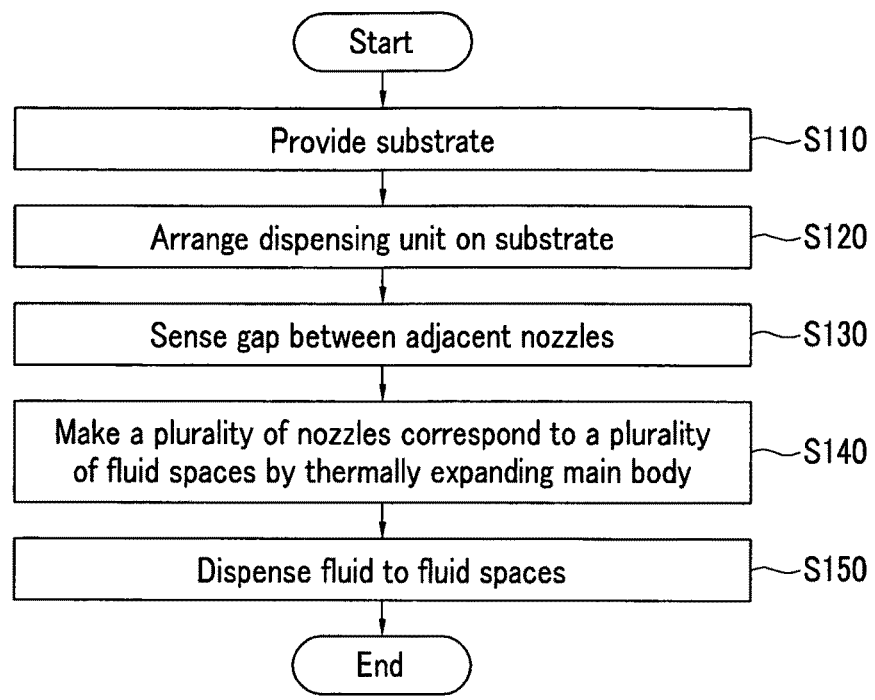
FIG. 3 illustrates a flowchart of a dispensing method according to an exemplary embodiment.

Hereinafter, a dispensing method according to an exemplary embodiment is described with reference to FIGS. 3 to 6. FIG. 3 illustrates a flowchart of a dispensing method according to an exemplary embodiment, and FIG. 4 to FIG. 6 illustrate stages in the dispensing method according to an exemplary embodiment.

Figure 4:
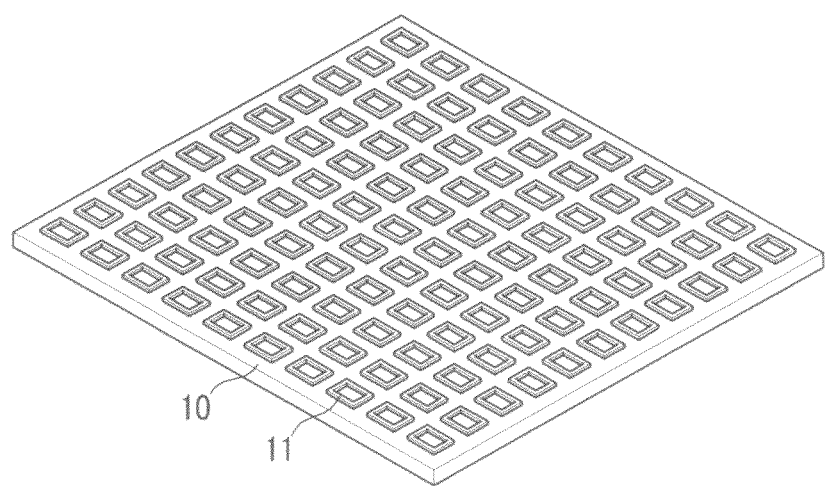
FIG. 4 to FIG. 6 illustrate stages in a dispensing method according to an exemplary embodiment.

Referring to FIG. 3 and FIG. 4, the substrate 10 may be provided, i.e., operation S110 in FIG. 3. As illustrated in FIG. 4, the substrate 10 may include a plurality of pixel structures 11, e.g., arranged in a matrix pattern, that define the plurality of pixels of the OLED display. The fluid-type organic light emitting material is to be dispensed onto the pixel structures 11 on the substrate 10.

Figure 5:
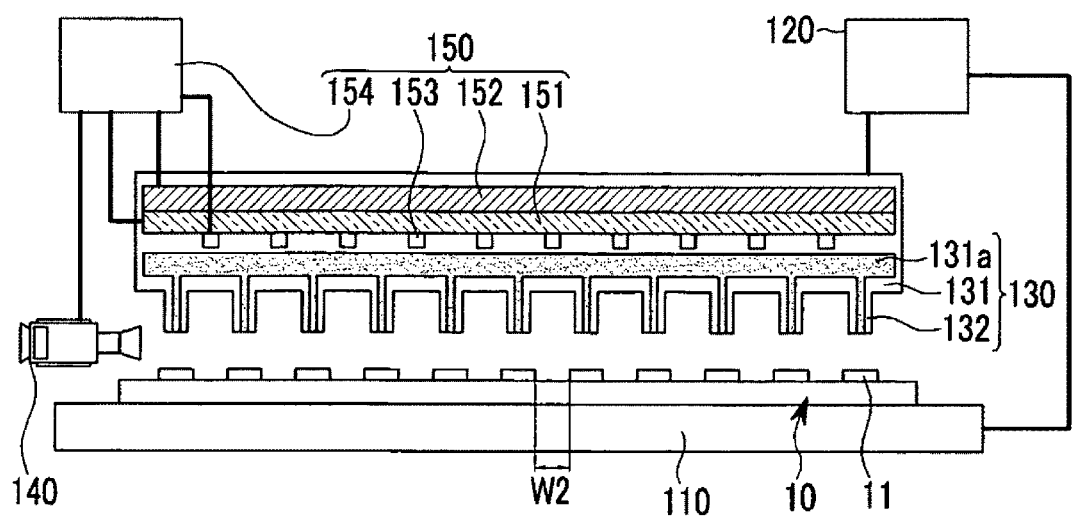
Figure 6:
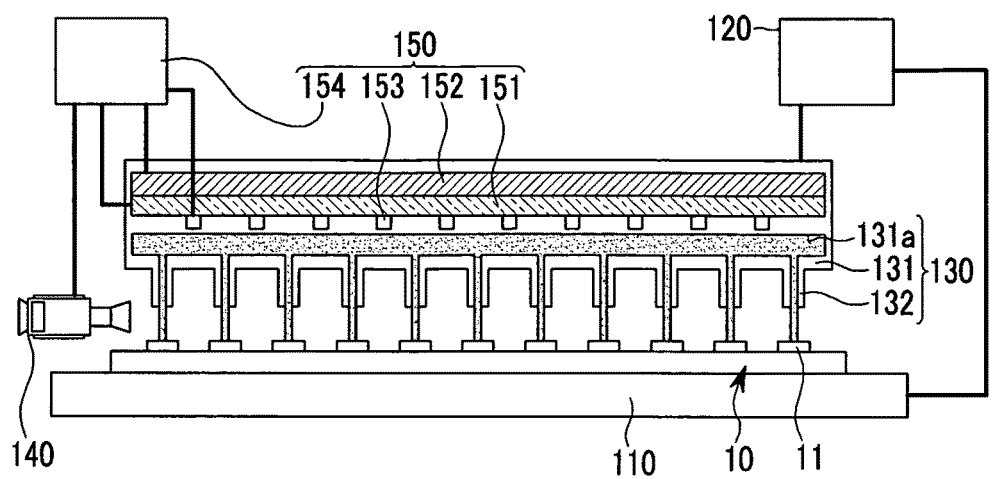

Next, referring to FIGS. 3 and 5, the dispensing unit 130 may be arranged above the substrate 10, i.e., operation S120 in FIG. 3. In detail, as illustrated in FIG. 5, the substrate 10 may be positioned on the seating unit 110, followed by arranging the dispensing unit 130 above the substrate 10. One or more of the seating unit 110 and the dispensing unit 130 may be moved by the arranging unit 120, so the nozzles 132 of the dispensing unit 130 may be above respective pixel structures 11 on the substrate 10.

Next, the gaps between adjacent nozzles 132 may be sensed by the gap sensor unit 140, i.e., operation S130 in FIG. 3. In detail, as illustrated in FIG. 5, the gaps between adjacent nozzles 132, i.e., the gap W1, may be sensed by the gap sensor unit 140. Further, a gap between adjacent pixel structures 11, i.e., gap W2, may be sensed by the gap sensor unit 140. The gap W1 between the nozzles 132 and the gap W2 between the pixel structures 11 sensed by the gap sensor unit 140, i.e., as discussed in detail with reference to FIG. 1 above, may be transmitted to the thermal expanding adjusting unit 150.

Next, the main body 131 may be thermally expanded or contracted, such that the nozzles 132 correspond to the pixel structures 11, i.e., operation S140 in FIG. 3. In detail, as illustrated in FIG. 5, the main body 131 may be thermally expanded or contracted by making the main body 131 of the dispensing unit 130 reach the predetermined temperature level. In other words, the temperature controller 154 of the thermal expanding adjusting unit 150 may control the heater 151 and/or the cooler 152, such that the nozzles 132 may be accurately aligned with the pixel structures 11 of the substrate 10 as sensed by the gap sensor unit 140. That is, the temperature of the main body 131 may be controlled to adjust the gap W1 between adjacent nozzles 132, so each nozzle 132 may accurately correspond to an underlying respective pixel structure 11, e.g., each nozzle 132 may be directly centered above a respective pixel structure 11.

The thermal expansion of the main body 131 may be performed by sensing the temperature of the main body 131, and then increasing or decreasing the temperature of the main body 131 until the temperature of the main body 131 reaches the predetermined temperature. Further, as the main body 131 thermally expands, the gaps W1 between adjacent nozzles 132 connected to the main body 131 may correspond to the gaps W2 between adjacent pixel structures 11, such that the nozzles 132 may accurately correspond to respective pixel structures 11.

Next, referring to FIGS. 3 and 6, fluid may be dispensed onto the pixel structures 11, i.e., operation S150 in FIG. 3. In detail, as illustrated in FIG. 6, fluid organic light emitting material may flow through the channel 131a of the main body 131, and may be individually dispensed and applied onto respective pixel structures 11 of the substrate 10 through the nozzles 132.

As described above, the dispensing apparatus 100 according to an embodiment may include nozzles 132 that accurately correspond to pixel structures 11 on a substrate 10. In particular, the main body 131 of the dispensing unit 130 may expand/contract in order to align the nozzles 132 with respective pixel structures 11 on the substrate 10, so the fluid light emitting material may be accurately dispensed through the nozzles 132 to respective pixel structures 11 on the substrate 10. Therefore, even if an error occurs in the gaps between adjacent pixel structures 11 of the substrate 10, the dispensing apparatus 100 may flexibly adjust the gap between the nozzles 132 to correspond to the pixel structures. Thus, it may be possible to flexibly deal with the manufacturing conditions of the substrate 10. Accordingly, the dispensing apparatus 100 and the corresponding dispensing method may provide accurate application of a light emitting material to a plurality of pixels of an OLED display, even if an error occurs in the gaps of the pixels structures.

Further, since the dispensing apparatus 100 according to an embodiment may adjust the gaps between the nozzles 132, a single dispensing apparatus 100 may be used for various substrates having various gaps between pixel structures 11. That is, the dispensing apparatus 100 according to an embodiment may dispense various types of fluid to various substrates with wide usage.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A dispensing apparatus, comprising:
   a dispensing unit including a main body, a channel through the main body, and a plurality of nozzles connected to and integral with each other and with the main body, the plurality of nozzles extending away from the surface of the main body, and the plurality of nozzles being configured to dispense fluid flowing in the channel onto a substrate;
   a gap sensor unit configured to determine size of gaps between adjacent nozzles in the dispensing unit; and
   a thermal expansion adjusting unit configured to thermally expand or contract the main body of the dispensing unit to adjust the gap size between adjacent nozzles to a predetermined size, based on the gap size determined by the gap sensor unit, the thermal expansion adjusting unit including a heater and a cooler disposed within the main body, the heater and cooler extending along the entire length of the main body, the heater and cooler being configured to respectively increase or decrease the temperature of the main body;
   a temperature sensor configured to sense the temperature of the main body;
   a temperature controller configured to control the heater such that the temperature of the main body sensed by the temperature sensor reaches a predetermined temperature corresponding to a required thermal expansion of the main body; and
   a seating unit configured to support the substrate with the plurality of nozzles configured in alignment or centered over respective pixels on the substrate to receive fluid dispensed from the plurality of nozzles;
   wherein the gap sensor unit is configured to further determine size of gaps between adjacent pixel structures on the substrate, and the thermal expansion adjusting unit is configured to adjust the gap size between adjacent nozzles in the dispensing unit in accordance with the size of gaps between the adjacent pixel structures, as determined by the gap sensor unit.

2. The dispensing apparatus as claimed in claim 1, wherein the cooler is configured to decrease the temperature of the main body, the temperature controller being configured to control the cooler to correspond to a required thermal contraction of the main body.

3. The dispensing apparatus as claimed in claim 1, wherein the gap sensor unit is a camera.

4. The dispensing apparatus as claimed in claim 1, further comprising:
   an arranging unit configured to arrange the main body on the substrate by moving one or more of the seating unit and the main body.

5. The dispensing apparatus as claimed in claim 1, wherein the dispensing unit is formed of invar or stainless steel.

6. The dispensing apparatus as claimed in claim 1, wherein the main body and the plurality of nozzles are formed of a same material.

7. The dispensing apparatus as claimed in claim 1, wherein the main body and the plurality of nozzles have a same thermal expansion coefficient.

8. The dispensing apparatus as claimed in claim 1, wherein an entire length of the heater is in direct contact with the main body.

9. A dispensing apparatus, comprising:
   a dispensing unit including a main body, a channel through the main body, and a plurality of nozzles connected to and integral with each other and with the main body, the plurality of nozzles extending away from the surface of the main body, and the plurality of nozzles being configured to dispense fluid flowing in the channel onto a substrate;
   a gap sensor unit configured to determine size of gaps between adjacent nozzles in the dispensing unit; and
   a thermal expansion adjusting unit configured to thermally expand or contract the main body of the dispensing unit to adjust the gap size between adjacent nozzles to a predetermined size, based on the gap size determined by the gap sensor unit, the thermal expansion adjusting unit configured to thermally expand or contract the main body of the dispensing unit to adjust the gap size between adjacent nozzles to a predetermined size based on the gap size determined by the gap sensor unit, the thermal expansion adjusting unit including a heater and a cooler disposed within the main body, the heater and cooler extending along the entire length of the main body, and the heater and cooler being configured to respectively increase or decrease the temperature of the main body;
   a temperature sensor configured to sense the temperature of the main body;
   a temperature controller configured to control the heater such that the temperature of the main body sensed by the temperature sensor reaches a predetermined temperature corresponding to a required thermal expansion of the main body;
   a seating unit configured to support the substrate with the plurality of nozzles configured in alignment or centered over respective pixels on the substrate to receive fluid dispensed from the plurality of nozzles; and
   an arranging unit configured to arrange the main body on the substrate by moving one or more of the seating unit and the main body.

* * * * *